United States Patent
Milicevic et al.

(10) Patent No.: US 9,831,068 B2
(45) Date of Patent: Nov. 28, 2017

(54) METHOD FOR ACTIVATING AN INNER SURFACE OF A SUBSTRATE TUBE FOR THE MANUFACTURING OF AN OPTICAL-FIBER PREFORM

(71) Applicant: Draka Comteq B.V., Amsterdam (NL)

(72) Inventors: Igor Milicevic, Helmond (NL); Gertjan Krabshuis, Sint Oedenrode (NL); Mattheus Jacobus Nicolaas Van Stralen, Tilburg (NL); Peter Gerharts, Eindhoven (NL); Johannes Antoon Hartsuiker, Eindhoven (NL)

(73) Assignee: Draka Comteq, B.V., Amsterdam (NL)

( * ) Notice: Subject to any disclaimer, the term of this patent is extended or adjusted under 35 U.S.C. 154(b) by 0 days.

(21) Appl. No.: 15/200,403

(22) Filed: Jul. 1, 2016

(65) Prior Publication Data

US 2017/0018406 A1  Jan. 19, 2017

(30) Foreign Application Priority Data

Jul. 13, 2015  (NL) ...................................... 2015162

(51) Int. Cl.

| B44C 1/22 | (2006.01) |
| C03C 15/00 | (2006.01) |
| C03C 25/68 | (2006.01) |
| C23F 1/00 | (2006.01) |
| H01J 37/32 | (2006.01) |
| C03B 37/012 | (2006.01) |
| C03B 37/018 | (2006.01) |

(52) U.S. Cl.
CPC .... *H01J 37/3244* (2013.01); *C03B 37/01228* (2013.01); *C03B 37/01861* (2013.01); *C03C 15/00* (2013.01); *H01J 37/32339* (2013.01); *H01J 2237/334* (2013.01)

(58) Field of Classification Search
USPC ........................................................ 216/67
See application file for complete search history.

(56) References Cited

U.S. PATENT DOCUMENTS

| 4,493,721 | A | 1/1985 | Auwerda et al. |
| 6,532,773 | B1 | 3/2003 | Mazzarese et al. |
| 7,068,899 | B2 | 6/2006 | Milicevic et al. |
| 7,522,800 | B2 | 4/2009 | Milicevic et al. |
| 2009/0004404 | A1* | 1/2009 | Hartsuiker ........ C03B 37/01815 427/579 |
| 2011/0247369 | A1 | 10/2011 | Milicevic et al. |
| 2014/0157829 | A1 | 6/2014 | Milicevic et al. |
| 2015/0315060 | A1 | 11/2015 | Milicevic et al. |

FOREIGN PATENT DOCUMENTS

| EP | 2008978 A1 | 12/2008 |
| EP | 2377825 A1 | 10/2011 |
| EP | 2743237 A1 | 6/2014 |
| EP | 2821378 A2 | 1/2015 |
| NL | 1023438 C2 | 11/2004 |

OTHER PUBLICATIONS

Search Report in counterpart Dutch Application No. 2015162 dated Feb. 25, 2016, pp. 1-5.
Extended Search Report in counterpart European Application No. 16175603.6 dated Dec. 20, 2016, pp. 1-5.

* cited by examiner

*Primary Examiner* — Roberts Culbert
(74) *Attorney, Agent, or Firm* — Additon, Higgins & Pendleton, P.A.

(57) ABSTRACT

A method activates the inner surface of a substrate tube via plasma etching with a fluorine-containing etching gas. An exemplary method includes the steps of (i) supplying a supply flow of gas to the interior of a substrate tube, wherein the supply flow includes a main gas flow and a fluorine-containing etching gas flow, (ii) inducing a plasma via electromagnetic radiation to create a plasma zone within the substrate tube's interior, and (iii) longitudinally reciprocating the plasma zone over the length of the substrate tube between a reversal point near the supply side and a reversal point near the discharge side of the substrate tube. The flow of the fluorine-containing etching gas is typically provided when the plasma zone is near the supply side reversal point.

21 Claims, No Drawings

METHOD FOR ACTIVATING AN INNER SURFACE OF A SUBSTRATE TUBE FOR THE MANUFACTURING OF AN OPTICAL-FIBER PREFORM

CROSS-REFERENCE TO PRIORITY APPLICATION

This application claims the benefit of pending Dutch Application No. 2015162 (filed Jul. 13, 2015, at the Dutch Patent Office), which is hereby incorporated by reference in its entirety.

FIELD OF THE INVENTION

The present invention relates to a method for activating an inner surface of a substrate tube for the manufacturing of an optical-fiber preform. The present invention further relates to the substrate tube obtained therewith.

BACKGROUND

One method for manufacturing optical fibers comprises depositing multiple thin films or layers of glass (e.g., glass layers) on the inside surface of a hollow substrate tube. Subsequently, the substrate tube is collapsed to form a core-rod, which is optionally sleeved or overcladded to form an optical-fiber preform from which optical fibers may be drawn.

The substrate tube has an outer surface (i.e., the outer surface of the wall of the substrate tube) and an inner surface (i.e., the inner surface of the wall of the substrate tube). The inner surface of the substrate tube is in contact with a cavity present on the inside of the substrate tube. In an embodiment, the substrate tube is cylindrical in shape and hence provides (or encloses) a cylindrical cavity.

The glass layers are applied on the inside of the substrate tube by introducing glass-forming gases (e.g., doped or undoped reactive gases) into the interior of the substrate tube from one end (i.e., the supply side of the substrate tube). Doped or undoped glass layers are deposited onto the interior surface of the substrate tube. The gases are discharged or removed from the other end of the substrate tube (i.e., the discharge side of the substrate tube), optionally by a vacuum pump. A vacuum pump generates a reduced pressure within the interior of the substrate tube.

During a PCVD (plasma chemical vapor deposition) process, a localized plasma is generated. Generally, electromagnetic radiation is directed toward an applicator via a waveguide. The applicator, which surrounds a glass substrate tube, couples the radiation into the plasma. In addition, the applicator and the substrate tube are generally surrounded by a furnace so as to maintain the substrate tube at a temperature of 900-1300° C. during the deposition process. The applicator (and hence the plasma it forms) is moved reciprocally in the substrate tube's longitudinal direction. A thin glass layer is deposited onto the interior surface of the substrate tube with every stroke or pass of the applicator.

The applicator is moved in translation over the length of the substrate tube within the boundaries of a surrounding furnace. With this translational movement of the applicator, the plasma also moves in the same direction. As the applicator reaches the furnace's inner wall near one end of the substrate tube, the movement of the applicator is reversed (this point is a reversal point) so that it moves to the other end of the substrate tube toward the furnace's other inner wall (and another reversal point). The applicator and thus the plasma travel in a back-and-forth movement along the length of the substrate tube. Each reciprocating movement is called a "pass" or a "stroke." Going from the reversal point near the supply side to the reversal point near the discharge side is a forward stroke or pass. Going from the reversal point near the discharge side to the reversal point near the supply side is a backward stroke or pass. With each pass, a thin layer of glass is deposited on the substrate tube's inside surface.

Normally, a plasma is generated only in a part of the substrate tube (e.g., the part surrounded by the microwave applicator), which part is called a plasma zone. Typically, the dimensions of the microwave applicator are smaller than the respective dimensions of the furnace and the substrate tube. Only at the position of the plasma are the reactive gases converted into glass and deposited on the inside surface of the substrate tube.

The passes increase the cumulative thickness of these thin films (i.e., the deposited material), which decreases the remaining internal diameter of the substrate tube. In other words, the hollow space inside the substrate tube gets progressively smaller with each pass.

This plasma causes the reaction of the glass-forming gases (e.g., $O_2$, $SiCl_4$, and, for instance, dopant gas $GeCl_2$ or other gases) that are supplied to the inside of the substrate tube. The reaction of the glass-forming gases allows reaction of Si (silicon), O (oxygen), and, for instance, the dopant Ge (germanium) to effect direct deposition of, for example, Ge-doped $SiO_x$ on the inner surface of the substrate tube. A substrate tube having a plurality of vitrified glass layers within is called a deposited tube (with a surrounding substrate tube). In an embodiment, the substrate tube is removed from the plurality of vitrified glass layers. This remaining tube consisting merely of deposited glass layers is also called a deposited tube.

When the deposition is complete, the deposited tube (with or without surrounding substrate tube) is heated to close the central cavity ("collapsed") to obtain a massive solid rod. This can optionally be externally provided with additional glass to increase its outer diameter, such as by applying silica by means of an outside deposition process or by placing the solid rod in a so-called jacket tube (or sleeve)—comprised of undoped silica—prior to the optical fiber drawing procedure, so as to increase the capacity of the optical-fiber preform thus obtained.

If an extremity of the optical-fiber preform is heated so that it becomes molten, a thin glass fiber can be drawn from the rod and be wound on a reel; the optical fiber then has a core portion and a cladding portion with relative dimensions and refractive indexes corresponding to those of the optical-fiber preform. The optical fiber can function as a waveguide, for example, for propagating optical telecommunication signals.

The glass-forming gases flushed through the substrate tube may also contain other components. The addition of a dopant gas such as $C_2F_6$ to glass-forming gases will lead to a reduction in the refractive index value of the silica.

Using an optical fiber for telecommunication requires that the optical fiber be substantially free from defects (e.g., discrepancies in the percentage of dopants, undesirable cross-sectional ellipticity, and the like), because, when considered over a large length of the optical fiber, such defects may cause a significant attenuation of the signal being transmitted. It is important, therefore, to realize a uniform and reproducible deposition process, because the quality of the deposited layers will eventually determine the quality of the fibers.

In order to have a good initial glass layer attachment on the interior wall of the substrate tube and to prevent the formation of bubbles in these initial glass deposited layers, preform manufacturers must pre-treat the inside of the substrate tube before the deposition process starts. This is also called a plasma-polishing or plasma-etching phase. Hence, generally before starting the deposition of glass layers inside the substrate tube, the inner surface of the initial substrate tube is pretreated or activated for achieving good adhesion and/or for preventing unwanted effects from pollutions that are present in the starting glass material of the substrate tube. This pretreatment or activation is generally carried out by etching. This etching is generally carried out by reciprocating a plasma in the substrate tube while flowing an etching gas—comprising a fluorine-containing compound, for example, FREON ($C_2F_6$), and optionally a carrier gas, such as oxygen ($O_2$)—through the substrate tube. Such a treatment will etch away glass material from the inside of the substrate tube. Usually after this treatment, the substrate tube has lost around 5-50 grams of silica from the inside surface.

This plasma polishing has been found to cause preferential etching on the inside surface of the substrate tube that can also vary between substrate tubes (e.g., batches). The preferential etching gives local disturbances in the vitrified silica layers deposited in the subsequent CVD process.

This means that on a small scale, one encounters big differences in the amount of material being etched away, which can cause increase the roughness of the inside surface. Due to this phenomenon, when the amount of deposited material increases, this initial roughness will create disturbances in the end product. This is especially severe for a multimode optical-fiber product as the refractive index profile will be also modified, thereby causing a degradation of quality.

Especially when many layers are deposited, the initial surface irregularities are amplified so clear distortions are visible in the resulting core rod. These irregularities may degrade the optical fiber drawn therefrom. Additionally, the plasma polishing may lead to many small (<<1 millimeter) distortions in the inside surface, especially in fluorine-doped tubes. These distortions will increase during the deposition process and finally droplet-type distortions will be evident on the inner surface after the deposition process. This is undesirable.

In order to prevent this uneven etching, in prior art methods, the substrate tube is usually washed before the employment in the lathe using hydrofluoric acid. The HF acid, because it flows through the tube, can improve the surface in such a way that the effects of the etching in the plasma-polishing phase are less severe for the surface. Unfortunately, HF is a highly hazardous material, which makes the use of it very risky from the environment and safety viewpoint. Thus, another solution has to be provided to overcome uneven etching.

The present inventors have previously devised a solution to this problem, which is disclosed in commonly assigned European Patent No. 2,743,237, which is hereby incorporated by reference in its entirety. This European patent discloses a procedure in which the inner surface of a glass substrate tube is activated by (i) first depositing a number of activation glass layers on the inner surface of the substrate tube having a total thickness of at least 10 micrometers and at most 250 micrometers, and (ii) second, at least partially (at least 30 percent) removing the activation glass layers by etching. Although this procedure is very effective, it takes additional time (typically 10 minutes) as well as additional glass-forming material. Moreover, this procedure is rather complex and may hence introduce errors and consequently a decreased yield. Furthermore, this procedure is not very suitable for fluorine-doped substrate tubes, which are softer, because it can lead to an increased, final non-circularity by using this filling and sanding procedure.

SUMMARY

The present invention embraces a method for activating the inner surface of a substrate tube in a way that does not induce an increase in the inner surface irregularities.

The present invention further embraces a method for homogeneous etching without the need to use additional glass-forming material.

The present invention still further embraces an etching method that is suitable for fluorine-doped substrate tubes. It is desired to provide a method to remove contamination in a fluorine-doped substrate tube with decreased distortions.

It is an aim to obtain good attachment of glass layers during the PCVD process. There is thus a need to have a pretreatment of the substrate tube that improves the smoothness of the inner surface to increase the homogeneity of deposited glass in the PCVD process.

In one aspect, the present invention relates to a method for activating an inner surface of a substrate tube for the manufacturing of an optical-fiber preform by means of plasma etching with an fluorine-containing etching gas, the plasma etching comprising the steps of (i) supplying a supply flow of gas to a central cavity of a substrate tube, wherein the supply flow comprises a main gas flow and a fluorine-containing etching gas flow; (ii) inducing a plasma by means of electromagnetic radiation in at least a part of the substrate tube to create a plasma zone in the central cavity of the tube; and (iii) moving the plasma zone back and forth in longitudinal direction over the length of the substrate tube between a reversal point located near the supply side and a reversal point located near the discharge side of the substrate tube (e.g., longitudinally reciprocating the plasma zone), wherein each forth and each back movement is called a stroke. In this regard, the flow of the fluorine-containing etching gas is provided predominantly, if not entirely, when the plasma zone is present between (i) the reversal point near the supply side and (ii) a pre-determined axial position located between the reversal point near the supply side and the reversal point near the discharge side (the "supply-side etching zone").

In an embodiment, the pre-determined axial position located between the reversal point near the supply side and the reversal point near the discharge side is separated from the reversal point near the supply side by a length equaling between 1 and 20 percent of the total available length of the substrate tube, such as by a length equaling between 5 and 10 percent of the total available length of the substrate tube.

In an embodiment, the predetermined axial position is the reversal point near the discharge side.

In an embodiment, the reversal point near the discharge side is separated from the reversal point near the supply side by a length equaling between 1 and 20 percent of the total available length of the substrate tube, such as by a length equaling between 5 and 10 percent of the total available length of the substrate tube In an embodiment, the fluorine-containing etching gas comprises a fluorine-containing compound and a carrier gas.

In an embodiment, the fluorine-containing compound is selected from the group consisting of $CCl_2$, $F_2$, $CF_4$, $C_2F_6$, $C_4F_8$, $SF_6$, $F_2$, $NF_3$, $SO_2F_2$, $CHF_3$, $CClF_3$, and $CCl_3F$, or a combination thereof.

In an embodiment, the fluorine-containing compound is $C_2F_6$.

In an embodiment, the fluorine-containing etching gas comprises only a fluorine-containing compound, such as $C_2F_6$.

In an embodiment, the carrier gas is selected from the group consisting of oxygen ($O_2$), nitrogen ($N_2$), and argon (Ar), or a combination thereof.

In an embodiment, the carrier gas is oxygen ($O_2$).

In an embodiment, the fluorine-containing etching gas comprises $C_2F_6$ as the fluorine-containing compound and $O_2$ as the carrier gas.

In an embodiment, the temperature of the etching step is less than about 1300° C., such as less than about 1250° C. (e.g., less than about 1200° C.).

In an embodiment, the width of the plasma zone is between 100 and 250 millimeters, such as 150 and 200 millimeters.

In an embodiment, the supply flow is between 3 and 5 slm.

In an embodiment, the fluorine-containing etching gas flow is between 100 and 500 sccm, such as 150 and 300 sccm of fluorine-containing compound and optionally between 1000 and 5000 sccm, such as 2000 and 4000 sccm, of carrier gas flow.

In an embodiment, the main gas flow is between 3 and 5 slm.

In a second aspect, the present invention relates to a process of manufacturing a preform for optical fibers by means of an inside vapor deposition process. The process includes the steps of (i) providing a substrate tube having an activated inner surface obtained according to the method of the first aspect; (ii) supplying doped and/or undoped glass-forming gases into the substrate tube having an activated inner surface, such as via the supply side thereof; (iii) depositing glass layers on the inside of the substrate tube (e.g., to form a deposited tube); and (iv) collapsing or consolidating the substrate tube thus obtained (e.g., the deposited tube) into an optical-fiber preform.

In a third aspect, the present invention relates to an optical-fiber preform obtained by or obtainable by the process according to the second aspect.

In a fourth aspect, the present invention relates to a method of manufacturing an optical fiber by drawing the optical-fiber preform according to the third aspect to form an optical fiber.

In a fifth aspect, the present invention relates to optical fiber obtained by the method according to the fourth aspect.

The foregoing illustrative summary, as well as other exemplary objectives and/or advantages of the invention, and the manner in which the same are accomplished, are further explained within the following detailed description.

DETAILED DESCRIPTION

The present invention embraces methods for activating a substrate tube's inner surface to facilitate the manufacturing of an optical-fiber preform. In this regard, the following definitions are used in the present description and claims to describe the disclosed subject matter. Other terms not cited (below) are meant to have the generally accepted meaning in the field.

"Activating" as used in the present description in combination with substrate tube means: pretreatment of a substrate tube before starting the deposition process. The activation takes place on the original or virgin inner surface of the substrate tube.

"Inner surface" as used in the present description means: the inside or interior surface of the substrate tube.

"Substrate tube" as used in the present description means: an elongated hollow tube having a cavity within; generally, the inside of the tube is provided (or coated) with a plurality of glass layers during the manufacturing of a preform. Generally, the substrate tube has a supply side and a discharge side. The substrate tube can be considered to consist of a wall enclosing a cavity. In other words, inside of the substrate tube a cavity is present; "cavity" being the space surrounded by the wall of the substrate tube.

"Available length" or "total available length" as used in the present description means: the effective length of the total substrate tube; the length of the substrate tube in which a plasma may by generated and within which deposition of glass may occur.

"Glass" or "glass material" as used in the present description means: crystalline or vitreous (glassy) oxide material—e.g., silica ($SiO_2$) or even quartz—deposited by means of a vapor deposition process. "Silica" as used in the present description means: any substance in the form of $SiO_x$, whether or not stoichiometric, and whether or not crystalline or amorphous.

"Plasma etching" as used in the present description means: an etching process in which the etching conditions for an etching gas are created or improved in a plasma.

"Etching gas" or "fluorine-containing etching gas" as used in the present description means: a gaseous fluorine-containing compound or a mixture of a gaseous fluorine-containing compound and a carrier gas used during the etching process; an etching gas is a gas, which under the appropriate conditions (e.g., temperature and concentration) is capable of removing glass materials through chemical action.

"Fluorine-containing compound" as used in the present description means: a compound comprising at least one bound fluorine atom, e.g., a fluorinated hydrocarbon. In an embodiment, the fluorine-containing compound is a hydrogen-free fluorine-containing compound; in other words, a fluorine-containing compound in which no hydrogen atoms are present, e.g., wherein all hydrogen atoms have been replaced by fluorine atoms.

"Carrier gas" as used in the present description means: a gas that dilutes the concentration of etching gas without reacting directly with the etching gas.

"Glass-forming gases" as used in the present description means: reactive gases used during the deposition process to form glass layers.

"Undoped glass-forming gases" as used in the present description means: gases without intentionally added dopants that are able to react to essentially pure silica glass.

As noted, the present invention relates to methods of activating a substrate tube used for the manufacture of an optical-fiber preform. The inside surface of the substrate tube is partially—near the supply side—removed by etching. The substrate tube is typically a glass substrate tube, such as a quartz substrate tube.

The present inventors have found that the etching step—required to obtain good adhesion—has some negative side effects. The present inventors have found out that the substrate tube as supplied (i.e. the original substrate tube) has a non-homogenous composition. This inhomogeneity will lead to a preferential etching in which some portions of the substrate tube's inner surface have more material removed than other portions of the substrate tube's inner surface—a localized effect that is observable via microscopic inspection. In other words, the etching is inhomogeneous over the inner surface of the substrate tube. This inhomogeneity causes severe problems during the deposition steps. The present inventors have found that by carrying out the etching step only near the supply side part of the substrate tube, the benefits of the etching process (e.g., improved adhesion) are retained whereas the negative side effects of the etching (e.g., the creation of surface inhomogeneity) are diminished or even fully eliminated.

The present inventors propose a new method in which significant plasma etching is applied only locally (e.g., when the resonator is near the reversal point near or at the gas supply side). The present inventors have observed that in this way, the gas-side part of the substrate tube is sufficiently heated, because a plasma originating from a fluorine-containing gas has a higher temperature than a plasma origination from inert gases. The present inventors have observed that the distortions due to etching are decreased or even eliminated in the part of the substrate tube that is finally drawn into an optical fiber.

Pretreating a selected length of an inside surface of the substrate tube before deposition of vitrified glass layers has been found by the present inventors to work very well. The selected length is located immediately adjacent to the reversal point near or at the gas supply side and typically extends for 1 to 20 percent of the total length of the substrate tube, which defines a "supply-side etching zone." The pretreatment includes supplying a fluorine-containing gas into the substrate tube only when the plasma is present in the selected length (e.g., when the plasma zone falls within the "supply-side etching zone"). The gas supply side of the substrate tube especially needs to reach the right temperature (e.g., high temperature), because the gas supply side of the substrate tube is never heated by the plasma tail.

The method of the invention uses the fact that when applying a fluorine-containing gas, such as $C_2F_6$, during the plasma-polishing phase, the substrate tube temperature will significantly rise. During experiments, the inventors have realized that the most important part of the substrate tube that has to be hot enough is the gas supply side of the substrate tube in the region where the resonator turns. In order to reach the desired temperature at this part and in order to avoid uneven etching of the tube surface, the present invention uses the supply of a fluorine-containing gas only when the resonator is at the gas supply side of the substrate tube (e.g., when the position of the resonator is below a certain axial position).

According to the present invention, sufficient fluorine-containing etching gas to cause substantial etching of the substrate tube is typically provided only when the plasma zone is present between the reversal point near the supply side and a pre-determined axial position between the reversal point near the supply side and the reversal point near the discharge side. That is, sufficient fluorine-containing etching gas to cause substantial etching of the substrate tube is typically provided only when the plasma zone falls within the "supply-side etching zone." In exemplary embodiments, enough fluorine-containing gas to cause substantial etching of the substrate tube is typically supplied to the substrate tube only when the plasma zone is near the reversal point at the substrate tube's supply side (e.g., the first 20 percent or so of the substrate tube's length that may define the "supply-side etching zone").

Those having ordinary skill in the art will appreciate, however, that a lesser amount of fluorine-containing gas can be supplied when the plasma zone is between (i) the reversal point near the substrate tube's discharge side and (ii) the pre-determined axial position between the reversal point near the supply side and the reversal point near the discharge side. In other words, fluorine-containing etching gas may be supplied to the substrate tube when the plasma zone is outside the region between (i) the reversal point near the supply side and (ii) a pre-determined axial position between the reversal point near the supply side and the reversal point near the discharge side as long as no significant etching occurs. As disclosed (above), the substrate tube region outside of this "supply-side etching zone" typically constitutes 80 percent or more of the total length of the substrate tube.

In an exemplary embodiment, the maximum flow of fluorine-containing etching gas supplied to the substrate tube when the plasma zone is completely outside of the "supply-side etching zone" is less than 25 percent (e.g., less than 20 percent) of the maximum flow of fluorine-containing etching gas supplied to the substrate tube when the plasma zone is within the "supply-side etching zone." In another exemplary embodiment, the maximum flow of fluorine-containing etching gas supplied to the substrate tube when the plasma zone is completely outside of the "supply-side etching zone" is less than 15 percent (e.g., less than 10 percent, such as less than 5 percent) of the maximum flow of fluorine-containing etching gas supplied to the substrate tube when the plasma zone is within the "supply-side etching zone." In yet another exemplary embodiment, no fluorine-containing etching gas is supplied to the substrate tube when the plasma zone is completely outside of the "supply-side etching zone."

The fluorine-containing gas is applied by using an additional gas supply line that enters the main gas line prior to introduction into the substrate tube. For instance, the combined main gas flow and a fluorine-containing etching gas are constituent flows of the supply gas flow to the interior of the substrate tube. The additional gas supply line includes piping with a valve containing an orifice (e.g., an electric) valve). The valve is controlled by a microcontroller or a PLC. Using the information about the resonator position, the fluorine-containing gas may be supplied in a certain region. When the resonator position passes the pre-selected axial position, the valve is closed.

In an embodiment, the resonator would only move over the length to be treated and the fluorine-containing gas is only supplied in this region. In this embodiment, the pre-determined axial position is the reversal point of the discharge side, and the longitudinal reciprocation of the plasma zone is typically less than about 20 percent of the total available length of the substrate tube. In a particular embodiment, the flow of the fluorine-containing gas is continuous, and the plasma zone is always within the "supply-side etching zone." This method depends upon the limitations of the sledge motor controllers.

When using the method according to the present invention, good deposition at the gas supply side is achieved and the surface non-uniform etching is decreased or even eliminated. The method will work very well for soft substrate tubes, where the method according to European Patent No. 2,742,237 is perhaps of limited use. The advantage is that the method may be used with a broader range of substrate tubes (especially softer tubes). There is also a time advantage versus other methods.

The present invention is moreover related to a process of manufacturing a preform for optical fibers by means of an inside vapor deposition process, which method includes the steps of (i) providing a substrate tube having an activated inner surface obtained according to the present method; (ii) supplying doped and/or undoped glass-forming gases into the substrate tube having an activated inner surface (typically via the supply side thereof); (iii) depositing a number of glass layers on the inside of the substrate tube; and (iv) collapsing or consolidating the substrate tube thus obtained into an optical-fiber preform.

The present invention also relates to the optical-fiber preform obtained therewith and to the optical fibers drawn therefrom.

The following embodiments for the present invention are applicable to all aspects of the present invention.

In an embodiment, the pre-determined axial position located between the reversal point near the supply side and the reversal point near the discharge side is separated from the reversal point near the supply side by a length equaling between 1 and 20 percent of the total available length of the substrate tube. Accordingly, only between 1 and 20 percent, typically between 5 and 10 percent, of the available length is etched.

In an embodiment, the predetermined axial position is the reversal point near the discharge side. This embodiment is applicable when the plasma only covers part of the substrate tube. In other words, the reversal point of the discharge side is very near the reversal point near the supply side (e.g., the respective reversal points are between 10 and 50 centimeters apart).

In an embodiment, the fluorine-containing compound in the fluorine-containing etching gas is typically supplied in an amount of at least 100 sccm (i.e., standard cubic centimeter per minute) under standard conditions (20° C. and 1 atmosphere), more typically at least 150 sccm, such as 200 sccm. The carrier gas in the fluorine-containing etching gas is supplied in an embodiment in an amount of between 1000 and 5000 sccm, such as between 2000 and 4000 sccm.

In an embodiment, the main gas flow is between 3 and 5 slm (i.e., standard liter per minute) under standard conditions (20° C. and 1 atmosphere). In an embodiment, the supply flow is similarly between 3 and 5 slm.

In another embodiment, the fluorine-containing etching gas includes a fluorine-containing compound and a carrier gas. In another embodiment, the fluorine-containing etching gas includes a hydrogen-free, fluorine-containing compound and a carrier gas. The advantage of this is that the absence of hydrogen atoms prevents the introduction of hydroxyl-groups during the deposition process. These hydroxyl-groups will cause increased attenuation of the optical fiber manufactured from the optical-fiber preform prepared from the activated substrate tube.

The fluorine-containing compound in the etching gas is selected from $CCl_2F_2$, $CF_4$, $C_2F_6$, $C_4F_8$, $SF_6$, $F_2$, $NF_3$, $SO_2F_2$, $CHF_3$, $CClF_3$, and $CCl_3F$, or one or more combinations thereof.

It should be noted that when fluorine-containing gases, such as $C_2F_6$, are used in a gas mixture with glass-forming gases, the fluorine from the fluorine-containing gases will be present in the deposited glass layers to provide down-doped glass layers. In such case, the fluorine-containing gas will not function as part of an etching gas but as a precursor to a dopant.

Typically, the etching gas includes a carrier gas, such as oxygen ($O_2$), nitrogen ($N_2$), or argon (Ar).

When a fluorocarbon compound (fluorinated carbon compound) is used in an etching gas, it is possible that deposition of elemental carbon takes place. Without wishing to be bound by any theory, the inventors propose that the fluorine atoms of the etching gas take care of the etching process and the carbon atoms of the etching gas are deposited on the inside surface of the substrate tube. In some cases, a black film forms. The use of oxygen ($O_2$) as carrier gas is preferred when a fluorocarbon compound is used. The oxygen was found by the present inventors to react with the carbon part of the etching gas to prevent carbon (C) deposition.

The concentration of the fluorine-containing compound in the etching gas and the temperature at which the gas flows across the surface of the oxide material present on the interior of the substrate tube affects the rate of removal of the deposited oxide material and/or contaminated region by the etching gas. Typically, the combination of the temperature and concentration of the fluorine-containing compound in the etching gas are sufficient to allow for a rapid etching rate (removal rate) of the deposited oxide material, which optimally results in decreasing the processing time of the substrate tube.

The plasma zone is typically obtained by a plasma generator, wherein the plasma power is typically set to a value between 1 and 10 kW, so that, in particular, melting of the substrate tube is prevented. In an embodiment, the width of the plasma zone is between 150 and 200 millimeters. The width of the plasma zone is an effect of, amongst others, the power of the plasma, the pressure inside of the substrate tube, and the diameter of the cavity of the substrate tube.

The process of the present invention results in improved deposited tube quality, which in turn leads to an increase in the quality of the optical-fiber preform, less rejection, and hence a higher yield, especially for high-end multimode optical fibers (e.g., multimode fibers complying with the OM3 and/or OM4 standards).

The present method will be illustrated in the following example, which is provided for the sake of illustration and which is not intended to limit the scope of the present invention.

EXAMPLE

A substrate tube made of quartz was manufactured by means of a standard PCVD process, such as known from commonly owned Dutch Patent No. NL 1,023,438, which is hereby incorporated by reference in its entirety.

A substrate tube having a supply side and a discharge side was placed in a furnace. An applicator, which was present in the furnace, could move back and forth along the length of the hollow substrate tube within the furnace. Microwave energy was supplied to the applicator via a waveguide so as to create plasma conditions in the interior of the hollow substrate tube. The plasma conditions functioned to etch the interior of the hollow substrate tube. The plasma generated by the applicator was present slightly outside the area surrounded by the applicator.

The quartz substrate tube was heated and etching was carried out by supplying a fluorine-containing etching gas, which was a combination of $C_2F_6$ (150 sccm) and $O_2$ (3500 sccm), to the interior of the hollow substrate tube. The flow of fluorine-containing etching gas was supplied only used when the plasma zone was in the region between the reversal point near the supply side and a predetermined axial position 100 millimeters away from the reversal point near the supply side. The duration of this etching phase was about 12 minutes. This achieved a substrate tube surface that was locally heated, activated, and prepared for further deposition of glass layers to create a desired, specific refractive index profile.

After the etching phase according to the present invention, a standard PCVD deposition process was carried out. Such an internal chemical vapor deposition process was carried out by moving the plasma back and forth along the length of the hollow substrate tube at a velocity of 20 m/min, the hollow substrate tube being positioned in the interior of a furnace. The furnace was set to a temperature of 1000° C. using a plasma power of 9 kW. The deposition rate of glass layers on the interior of the thus positioned hollow substrate tube was 3.1 g/min, based on $SiO_2$, with the pressure inside the hollow substrate tube amounting to about 10 mbar. A gas composition of $O_2$, $SiCl_4$, $GeCl_4$, and $C_2F_6$ was supplied to the interior of the hollow substrate tube. The substrate tube thus obtained was ready for collapsing into a solid preform. The deposited tube was inspected under polarized light for the presence of the droplets or other irregularities on the inside thereof, but there were no droplets or other irregularities found.

In the specification, typical embodiments of the invention have been disclosed. The present invention is not limited to such exemplary embodiments. The use of the term "and/or" includes any and all combinations of one or more of the associated listed items. Unless otherwise noted, specific terms have been used in a generic and descriptive sense and not for purposes of limitation.

The invention claimed is:

1. A method for activating an inner surface of a substrate tube for the manufacturing of an optical-fiber preform by means of plasma etching with a fluorine-containing etching gas, the plasma etching comprising the steps of:
    supplying a supply flow of gas to a central cavity of a substrate tube, wherein the supply flow comprises a main gas flow and a fluorine-containing etching gas flow;
    inducing a plasma by means of electromagnetic radiation in at least a part of the substrate tube to create a plasma zone in the central cavity of the substrate tube; and
    moving the plasma zone back and forth in longitudinal direction over the length of the substrate tube between a reversal point located near the supply side and a reversal point located near the discharge side of the substrate tube;
    wherein the flow of the fluorine-containing etching gas is provided only when the plasma zone is present between the reversal point near the supply side and a pre-determined axial position located between the reversal point near the supply side and the reversal point near the discharge side; and
    wherein the pre-determined axial position located between the reversal point near the supply side and the reversal point near the discharge side is separated from the reversal point near the supply side by a length equaling between 1 and 20 percent of the total available length of the substrate tube.

2. The method according to claim 1, wherein the pre-determined axial position located between the reversal point near the supply side and the reversal point near the discharge side is separated from the reversal point near the supply side by a length equaling between 5 and 10 percent of the total available length of the substrate tube.

3. The method according to claim 1, wherein the predetermined axial position is the reversal point near the discharge side.

4. The method according to claim 1, wherein the fluorine-containing etching gas comprises a fluorine-containing compound and a carrier gas.

5. The method according to claim 4, wherein:
    the fluorine-containing compound is selected from the group consisting of $CCl_2F_2$, $CF_4$, $C_2F_6$, $C_4F_8$, $SF_6$, $F_2$, $NF_3$, $SO_2F_2$, $CHF_3$, $CClF_3$, and $CCl_3F$, or a combination thereof; and/or
    the carrier gas is selected from the group consisting of oxygen ($O_2$), nitrogen ($N_2$), and argon (Ar), or a combination thereof.

6. The method according to claim 4, wherein the fluorine-containing compound is $C_2F_6$ and the carrier gas is $O_2$.

7. The method according to claim 4, wherein the fluorine-containing etching gas flow comprises the fluorine-containing compound in an amount between 100 sccm and 500 sccm.

8. The method according to claim 4, wherein the fluorine-containing etching gas flow comprises the carrier gas in an amount between 1000 sccm and 5000 sccm.

9. The method according to claim 1, wherein the temperature of the plasma-etching steps is about 1300° C. or less.

10. The method according to claim 1, wherein:
    the supply flow is between 3 and 5 slm; and/or
    the main gas flow is between 3 and 5 slm.

11. The method according to claim 1, wherein the reversal point near the discharge side is separated from the reversal point near the supply side by a length equaling between 1 and 20 percent of the total available length of the substrate tube.

12. The method according to claim 1, wherein the reversal point near the discharge side is separated from the reversal point near the supply side by a length equaling between 5 and 10 percent of the total available length of the substrate tube.

13. A process of manufacturing an optical-fiber preform via inside vapor deposition, the process comprising the steps of:
    providing a substrate tube having an activated inner surface obtained according to the method of claim 1;
    supplying doped and/or undoped glass-forming gases into the substrate tube having an activated inner surface;
    depositing glass layers on the inside of the substrate tube to form a deposited tube; and
    collapsing the deposited tube into an optical-fiber preform.

14. An optical-fiber preform made by the process according to claim 13.

15. A method of manufacturing an optical fiber by drawing the optical-fiber preform according to claim 14.

16. An optical fiber made by the method according to claim 15.

17. A method for activating an inner surface of a substrate tube via plasma etching with a fluorine-containing etching gas, comprising:
    supplying a supply flow of gas to the interior of a substrate tube, wherein the supply flow includes a main gas flow and a fluorine-containing etching gas flow;
    inducing a plasma via electromagnetic radiation to create a plasma zone within the substrate tube's interior; and
    longitudinally reciprocating the plasma zone between a reversal point near the supply side of the substrate tube and a reversal point near the discharge side of the substrate tube, wherein the reversal point near the discharge side of the substrate tube is separated from the reversal point near the supply side of the substrate tube by a length equaling between 1 and 20 percent of the total available length of the substrate tube.

18. The method according to claim 17, wherein the fluorine-containing etching gas comprises a fluorine-containing compound and a carrier gas.

19. The method according to claim 18, wherein:
the fluorine-containing compound comprises $CCl_2F_2$, $CF_4$, $C_2F_6$, $C_4F_8$, $SF_6$, $F_2$, $NF_3$, $SO_2F_2$, $CHF_3$, $CClF_3$, or $CCl_3F$, or a combination thereof; and/or
the carrier gas comprises oxygen ($O_2$), nitrogen ($N_2$), or argon (Ar), or a combination thereof.

20. The method according to claim 18, wherein the fluorine-containing compound is $C_2F_6$ and the carrier gas is $O_2$.

21. The method according to claim 17, wherein the reversal point near the discharge side of the substrate tube is separated from the reversal point near the supply side of the substrate tube by a length equaling between 5 and 10 percent of the total available length of the substrate tube.

* * * * *